(12) United States Patent
Hodson

(10) Patent No.: US 7,005,742 B2
(45) Date of Patent: Feb. 28, 2006

(54) SOCKET GRID ARRAY

(75) Inventor: Kenneth George Hodson, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 14 days.

(21) Appl. No.: 10/772,960

(22) Filed: Feb. 5, 2004

(65) Prior Publication Data

US 2005/0173795 A1   Aug. 11, 2005

(51) Int. Cl.
*H01L 23/48* (2006.01)

(52) U.S. Cl. .................. 257/737; 257/737; 257/778

(58) Field of Classification Search ........... 257/737, 257/778, 777, 780, 779
See application file for complete search history.

(56) References Cited

U.S. PATENT DOCUMENTS

| 5,591,941 | A | * | 1/1997 | Acocella et al. ............ 174/266 |
| 5,628,919 | A | * | 5/1997 | Tomura et al. ............... 216/18 |
| 5,956,606 | A | * | 9/1999 | Burnette ..................... 438/615 |
| 6,624,512 | B1 | * | 9/2003 | Kurusu ....................... 257/737 |

FOREIGN PATENT DOCUMENTS

GB    2325354    * 11/1998

* cited by examiner

*Primary Examiner*—David Nelms
*Assistant Examiner*—Thinh T Nguyen
(74) *Attorney, Agent, or Firm*—Yingsheng Tung; Wade James Brady, III; Frederick J. Telecky, Jr.

(57) ABSTRACT

Assembly methods and semiconductor device assemblies are disclosed in which corresponding IC sockets and PCB projections are used for alignment and bond formation between IC and PCB components of a completed assembly, for example, a BGA. Embodiments of the invention further provide the capability of disassembly and reassembly.

12 Claims, 3 Drawing Sheets

SOCKET GRID ARRAY

TECHNICAL FIELD

The invention relates to semiconductor devices and integrated circuits (ICs). More particularly, it relates to new socket grid array devices and methods for assembling the same.

BACKGROUND OF THE INVENTION

Semiconductor devices are subject to many competing design goals. When considering resin encapsulated semiconductor devices in terms of mounting approaches, packaged devices may be roughly classified into the pin insertion type and the surface mount type. Since it is very often desirable to minimize the profile of electronic apparatus, surface mount semiconductor devices are often preferred, such as for example, ball grid array (BGA) devices. BGAs are commonly used in applications requiring high-density surface-mounted devices. BGAs known in the arts are generally assembled by affixing an integrated circuit (IC) device to a printed circuit board (PCB). The BGA and PCB have corresponding contact points, or bond pads. The components are aligned, typically using sophisticated optical aligning tools, and solder balls pre-positioned at the contact points are reflowed. Obtaining the precise alignment necessary to properly position the corresponding contact points on the BGA and PCB presents a serious challenge. When completed, the BGA/PCB assembly solder joints are typically "blind," that is, they are not readily accessible for visual inspection. Due to the blind solder joints, troubleshooting an assembly often requires specialized tools such as x-ray equipment or fiber-optic equipped "BGA microscopes". Due to the complexity of the devices, it is sometimes desirable to remove a BGA device from a PCB for independent testing or replacement. Removal and replacement are made difficult by the same type alignment and soldering constraints as encountered in assembly.

Due to these and other problems, improved alignment techniques, accessibility, replaceability, and increasingly robust and durable devices are desirable in the arts.

SUMMARY OF THE INVENTION

In carrying out the principles of the present invention, in accordance with preferred embodiments thereof, methods and devices of the invention provide sockets and projections facilitating alignment and attachment of an IC to a PCB.

According to one aspect of the invention, a method of assembling a semiconductor device includes a step of providing a plurality of sockets on the mounting surface of a IC device and corresponding projections on the mounting surface of a PCB. In a further step, the IC device and the PCB are positioned with corresponding sockets and projections in alignment. The IC is then affixed to the PCB.

According to an additional aspect of the invention, a semiconductor device assembled according to preferred embodiments of the invention may be disassembled by a step of detaching the IC from the PCB.

According to a further aspect of the invention, a step of reaffixing a detached IC to the PCB may be performed.

According to still another aspect of the invention, an embodiment of a semiconductor assembly includes an IC having a plurality of metallic sockets arrayed on a mounting surface. The semiconductor assembly also includes a PCB having a plurality of metallic projections arrayed on a mounting surface. The PCB and IC are positioned so that some of the sockets adjoin some of the projections, and solder joints couple the adjoining IC sockets and PCB projections.

According to a further aspect of the invention, solder joints coupling the IC and PCB are designed to be readily detachable.

Preferred embodiments of the invention are disclosed include use in BGA assemblies.

The invention provides technical advantages including but not limited to providing semiconductor device assemblies and methods having readily aligned bonding surfaces and robust, removable, and replaceable, solder joints. These and other features, advantages, and benefits of the present invention can be understood by one of ordinary skill in the art upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to the references in the figures unless otherwise noted. Descriptive and directional terms used in the written description such as first, second, top, bottom, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

In general, the methods and apparatus of the invention provide improved semiconductor device assemblies such as, for example, BGAs.

Figure 1:
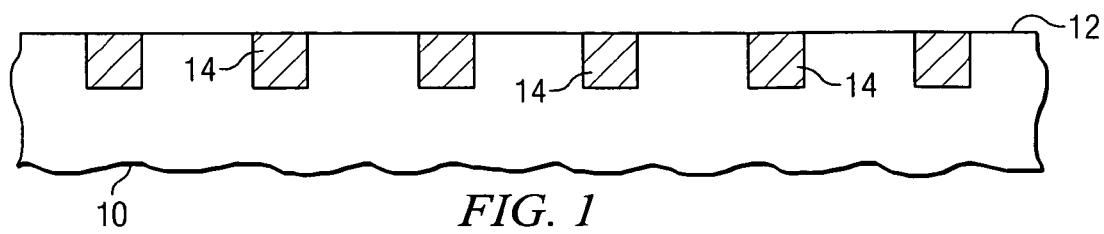
FIG. 1 is a cut away partial side view of an example of a PCB according to a preferred embodiment of the invention.

Now referring first to FIG. 1, exemplary embodiments of the invention and steps in their assembly are shown in partial cross section. A printed circuit board (PCB) 10 is shown. The PCB 10 has a surface 12 for mounting an IC. Typically, the mounting surface 12 has numerous metal contact points 14 designed for making electrical connections with a mounted device.

Figure 2:
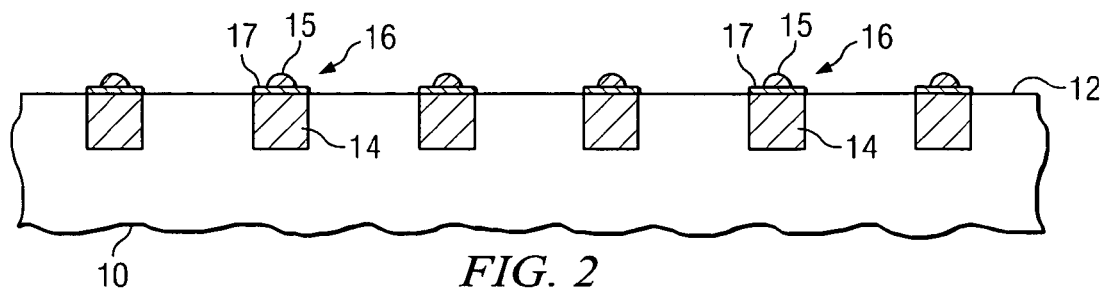
FIG. 2 is a cut away partial side view of a PCB with solder added, further illustrating an example of a preferred embodiment of the invention.

Now referring primarily to FIG. 2, a cross section of a portion of a PCB 10 is shown exhibiting a further step in the assembly of a semiconductor device according to a preferred embodiment of the invention. Numerous projections 16 are attached to the contact points 14. The projections 16 are metallic, for example, preferably copper, aluminum, gold, or one or metals or alloys selected for their conductivity and amenability to soldering. The projections 16 may be made using individual nodes 15 of metal, in this example generally hemispherical in shape. Preferably, if individual nodes 15 are used, they are positioned using pick-and-place procedures familiar in the arts. The nodes 15 are preferably attached to the contact points 14 with solder 17, although adhesive such as epoxy may also be used, to form a completed projection 16. If solder 17 is used, high temperature solder 17 is preferred. Although the projections 16 appear as single units in the drawings, it should be understood that they may be also constructed of multiple metallic layers. The projections may alternatively be formed in place on the contact points using masking, deposition, and etching techniques known in the arts.

Figure 3:
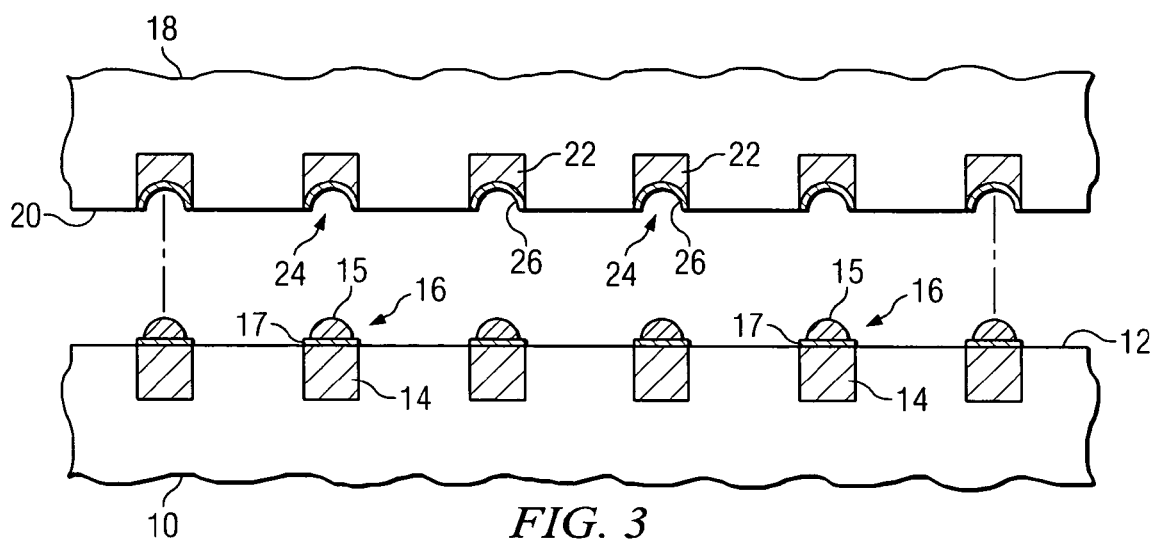
FIG. 3 is a cut away partial side view of an example of a PCB and a BGA according to a preferred embodiment of the invention.

FIG. 3 exhibits a PCB 10 cross section with a IC 18, also shown in cross section, positioned with a mounting surface 20 adjacent to the mounting surface 12 of the PCB 10. The IC 18 has numerous contact points 22 on its mounting surface 20. Preferably, the contact points 22 are positioned in alignment with the contact points 14 of the PCB 10. As shown in the preferred embodiment, the contact points 22 each have a socket 24. The sockets 24 are configured for receiving the projections 16 of the PCB 10, and for the disposition of solder 26 in between. The sockets 24 are preferably formed by patterning, etching, and deposition processes known in the arts, but may also be drilled or punched into the contact points 22.

Figure 4:
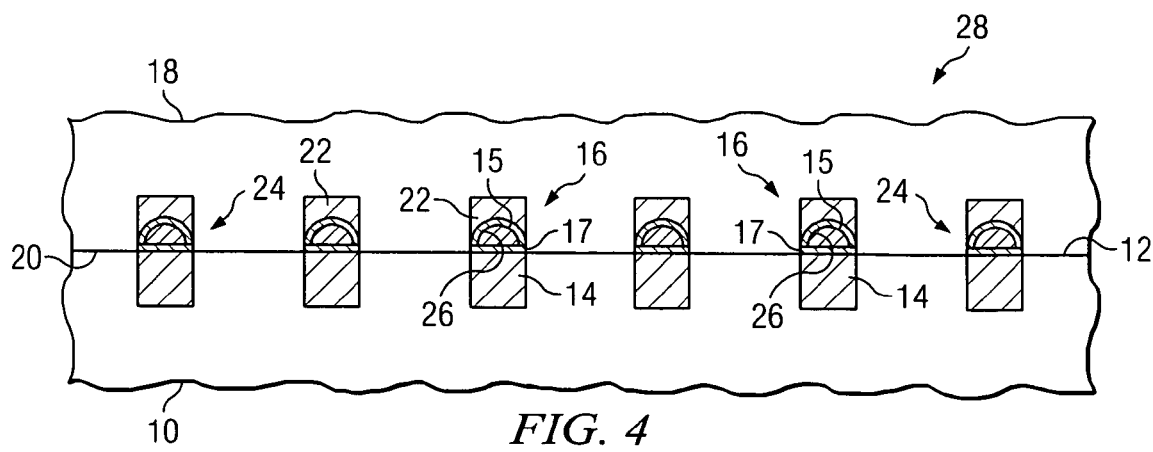
FIG. 4 is a cut away partial side view of a BGA affixed to a PCB further illustrating an example of a preferred embodiment of the invention.

A partial cross section view of a semiconductor device assembly 28 according to an example of a preferred embodiment of the invention is shown in FIG. 4. The IC 18 is shown affixed to the PCB 10 with the contact points 14, 22, of their adjacent mounting surfaces, 12, 20, in alignment. According to the methods of the invention, the projections 16 and sockets 24 are preferably used to ensure correct alignment, either with or without the assistance of optical alignment tools known in the arts. When the sockets 24 and projections 16 are in alignment, the solder 26 placed in between is reflowed and allowed to harden forming a mechanically secure and electrically conductive bond. In the presently preferred embodiment of the invention, low temperature solder 26 is used. The use of low temperature solder 26 permits the disassembly of the semiconductor device assembly 28 shown in FIG. 4 into the separate IC 18 and PCB components shown in FIG. 3 by reflowing the low temperature the solder 26 without reflowing the higher temperature solder 17.

Figure 5:
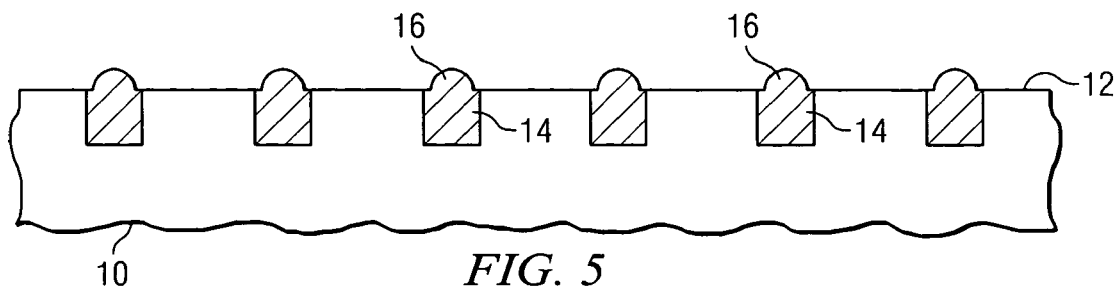
FIG. 5 is a cut away partial side view of an example of a PCB according to an example of an alternative embodiment of the invention.

Now referring primarily to FIG. 5, exemplary alternative embodiments of the invention and steps in the assembly of semiconductor devices according to the invention are shown in partial cross section. A printed circuit board (PCB) 10 is shown. The PCB 10 has a surface 12 for mounting an IC. The mounting surface 12 has numerous metal contact points 14 for making electrical connections with a mounted device. In this embodiment of the invention, the contact points 14 include projections 16. The numerous projections 16 integral portions of the contact points 14, preferably copper other metal selected for PCB use for good for conductivity and soldering characteristics. As mentioned above, the projections 16 may be constructed of multiple metallic layers formed on the contact points 14 using masking, deposition, and etching techniques known in the arts.

Figure 6:
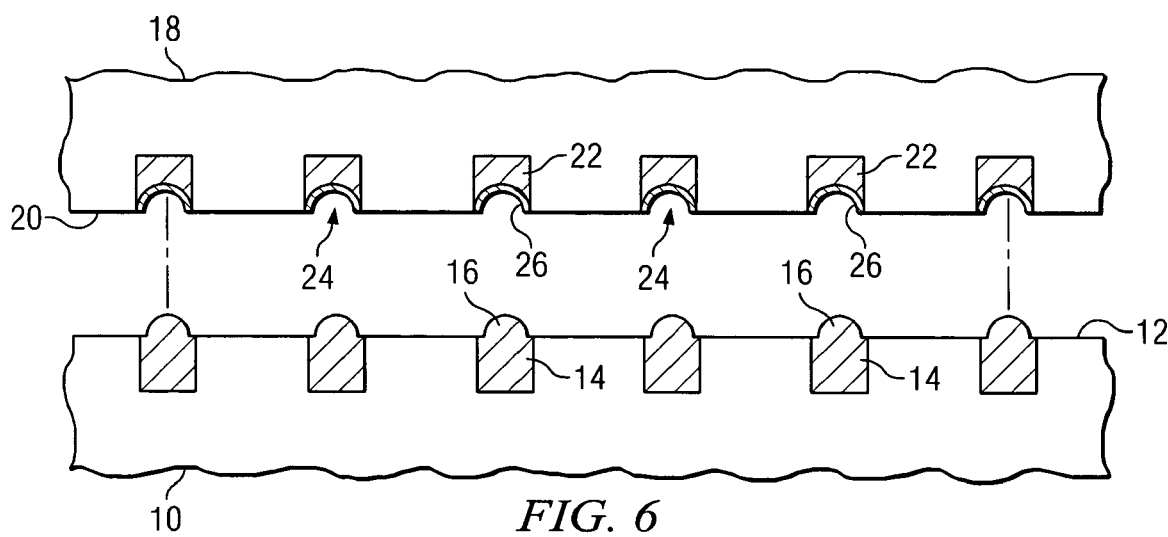
FIG. 6 is a cut away partial side view of a PCB and a BGA according to an example of an alternative embodiment of the invention.

FIG. 6 exhibits a PCB 10 cross section with a IC 18, also shown in cross section, positioned with a mounting surface 20 adjacent to the mounting surface 12 of the PCB 10. The IC 18 has numerous contact points 22 on its mounting surface 20. Preferably, the contact points 22 are positioned in alignment with the contact points 14 of the PCB 10. As shown in the preferred embodiment, the contact points 22 each have a socket 24. The sockets 24 are configured for receiving the projections 16 of the PCB 10. Solder 26 is positioned in the sockets 24.

Figure 7:
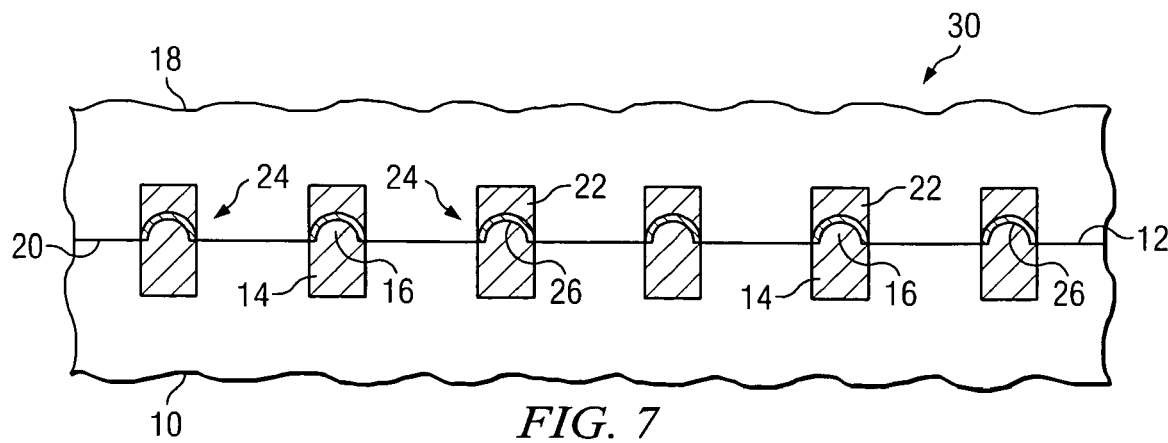
FIG. 7 is a cut away partial side view of a BGA affixed to a PCB further illustrating an example of an alternative embodiment of the invention.

FIG. 7 illustrates a partial cross section view of a semiconductor device assembly 30 according to an example of an alternative embodiment of the invention. The IC 18 is shown affixed to the PCB 10 with the contact points 14, 22, of their adjacent mounting surfaces, 12, 20, aligned. Using the methods of the invention, the projections 16 and sockets 24 are preferably used to ensure correct alignment, either with or without the assistance of optical alignment tools known in the arts. When the sockets 24 and projections 22 are in alignment, the solder 26 is reflowed and allowed to harden forming a mechanically secure and electrically conductive bond. It should be noted that the disassembly of the assembly 30 of FIG. 7 may be accomplished by again reflowing the solder 26 separating the constituent PCB 10 and IC 18 components as shown in FIG. 6.

Figure 8:
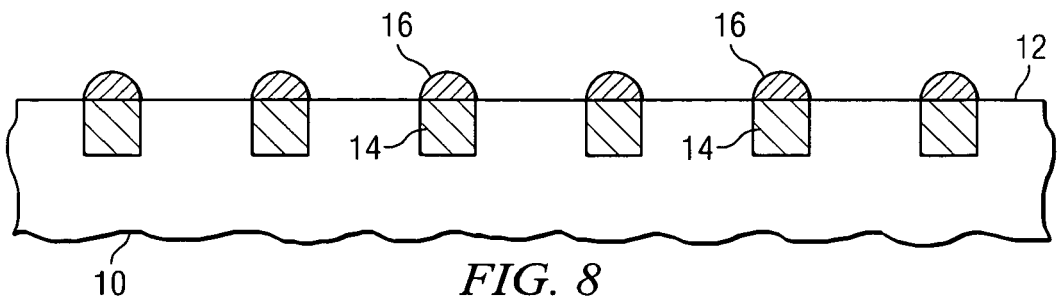
FIG. 8 is a cut away partial side view of a PCB with solder added, further illustrating an example of an alternative embodiment of the invention.

Now referring to FIG. 8, another example of alternative embodiments of the invention is described. A PCB 10 as shown initially in FIG. 1 includes projections 16 added to contact points 14 by the attachment of solder balls. The term "solder balls" as used in the arts refers to nodules of solder, which are often not ball-shaped.

Figure 9:
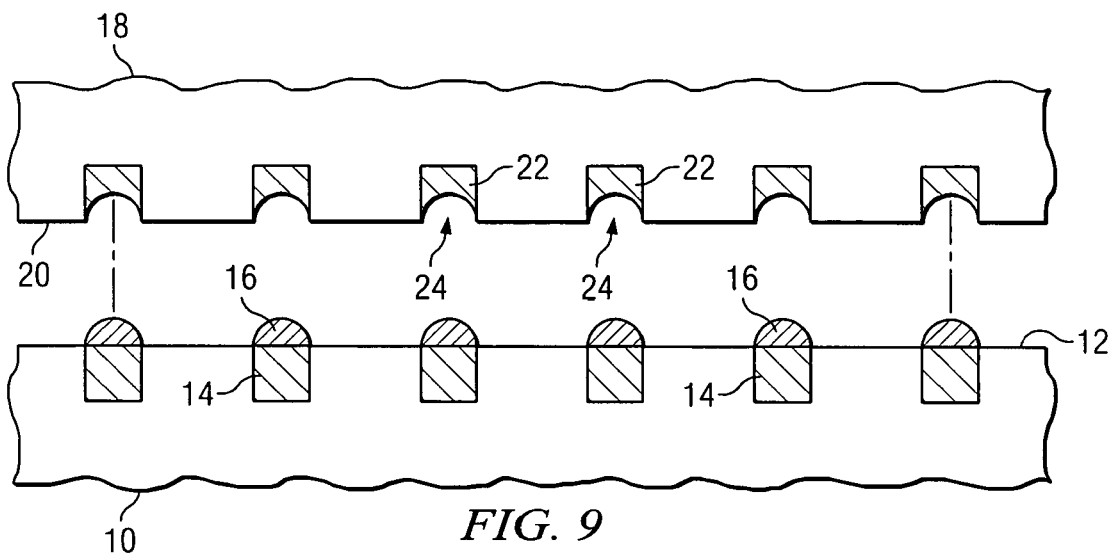
FIG. 9 is a cut away partial side view of a PCB and a BGA according to an example of an alternative embodiment of the invention.

In FIG. 9, the PCB 10 of FIG. 8 is shown with a IC 18 positioned with the mounting surface 20 adjacent to the mounting surface 12 of the PCB 10. Preferably, the contact points 22, 14 of the IC 18 and PCB 10 are positioned in alignment. The contact points 22 of the IC 18 each have a socket 24. The sockets 24 are configured for receiving the solder ball projections 16 of the PCB 10.

Figure 10:
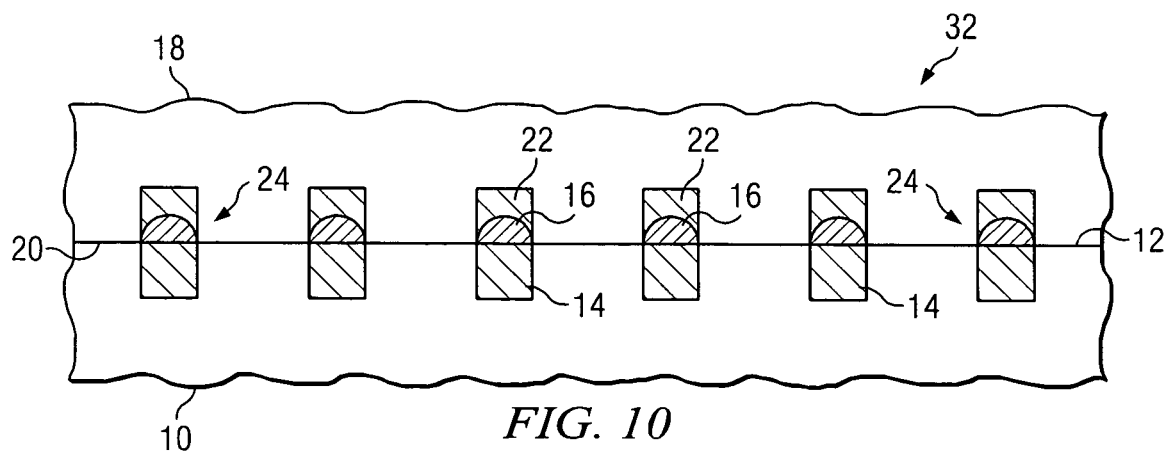
FIG. 10 is a cut away partial side view of a BGA affixed to a PCB further illustrating an example of an alternative embodiment of the invention.

A partial cross section view of a completed semiconductor device assembly 32 according to an alternative example of an embodiment of the invention is shown in FIG. 10. The IC 18 is shown affixed to the PCB 10 with the contact points 14, 22, of their adjacent mounting surfaces, 12, 20, aligned. Using the methods of the invention, the projections 16 and sockets 24 are preferably used to ensure correct alignment, either with or without the assistance of optical alignment tools known in the arts. When the sockets 24 and projections 16 are in alignment, the solder ball projections 16 are reflowed and allowed to harden forming a mechanically secure and electrically conductive bond. Disassembly of the semiconductor device assembly 32 of may be accomplished by again reflowing the solder ball projections 16, separating the constituent PCB 10 and IC 18 components as shown in FIG. 9.

Thus, the invention provides reliable removable and replaceable solder joints for joining an IC to a PCB. The methods and devices of the invention provide advantages including facilitation of alignment during assembly and reassembly. While the invention has been described with reference to certain illustrative embodiments, the methods and apparatus described are not intended to be construed in a limited sense. Various modifications and combinations of the illustrative embodiments as well as other advantages and embodiments of the invention will be apparent to persons skilled in the art upon reference to the description and claims.

I claim:

1. A semiconductor assembly comprising:
   a IC having a plurality of metallic sockets arrayed on a mounting surface;
   a PCB having a plurality of metallic projections arrayed on a mounting surface;
   wherein the PCB and IC are positioned so that a plurality of the sockets adjoin a plurality of the projections; and
   a plurality of solder joints coupling the IC sockets adjoining the PCB projections.

2. A semiconductor assembly according to claim 1 wherein the solder joints are detachable.

3. A semiconductor assembly according to claim 1 wherein the solder joints comprise low melting point solder.

4. A semiconductor assembly according to claim 1 wherein the projections on the mounting surface of the PCB further comprise high melting point solder.

5. A semiconductor assembly according to claim 1 wherein the projections on the mounting surface of the PCB further comprise metallic nodes affixed to selected locations on the PCB.

6. A semiconductor assembly according to claim 1 wherein the projections on the mounting surface of the PCB further comprise metallic nodes affixed to selected locations on the PCB by high melting point solder.

7. A BGA assembly comprising:
   a IC having a plurality of metallic sockets arrayed on a mounting surface;
   a PCB having a plurality of metallic projections arrayed on a mounting surface;
   wherein the PCB and IC are positioned so that a plurality of the sockets adjoin a plurality of the projections; and
   a plurality of solder joints coupling the IC sockets adjoining the PCB projections.

8. A BGA assembly according to claim 7 wherein the solder joints are detachable.

9. A BGA assembly according to claim 7 wherein the solder joints comprise low melting point solder.

10. A BGA assembly according to claim 7 wherein the projections on the mounting surface of the POB further comprise high melting point solder.

11. A BGA assembly according to claim 7 wherein the projections on the mounting surface of the PCB further comprise metallic nodes affixed to selected locations on the PCB.

12. A BGA assembly according to claim 7 wherein the projections on the mounting surface of the PCB further comprise metallic nodes affixed to selected locations on the PCB by high melting point solder.

* * * * *